US008999107B2

(12) United States Patent
Cadotte et al.

(10) Patent No.: US 8,999,107 B2
(45) Date of Patent: Apr. 7, 2015

(54) LASER ASHING OF POLYIMIDE FOR SEMICONDUCTOR MANUFACTURING

(75) Inventors: Maxime Cadotte, Granby (CA); Luc Guerin, Granby (CA); Van Thanh Truong, Brossard (CA); Steve Whitehead, Shefford (CA)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 13/285,408

(22) Filed: Oct. 31, 2011

(65) Prior Publication Data

US 2012/0111496 A1    May 10, 2012

(30) Foreign Application Priority Data

Nov. 5, 2010    (CA) ..................................... 2719927

(51) Int. Cl.
| | | |
|---|---|---|
| *B32B 38/10* | (2006.01) | |
| *H01L 21/301* | (2006.01) | |
| *H01L 21/02* | (2006.01) | |
| *B08B 7/00* | (2006.01) | |
| *B23K 26/40* | (2014.01) | |
| *H01L 21/311* | (2006.01) | |
| *H01L 23/00* | (2006.01) | |

(52) U.S. Cl.
CPC ........ *H01L 21/02076* (2013.01); *B08B 7/0042* (2013.01); *B23K 26/4065* (2013.01); *H01L 21/31127* (2013.01); *H01L 24/27* (2013.01); H01L 2924/01057 (2013.01); H01L 2924/01079 (2013.01); H01L 2924/3025 (2013.01); H01L 2924/01006 (2013.01); H01L 2924/01033 (2013.01); H01L 2924/01074 (2013.01); H01L 2924/014 (2013.01); Y10S 156/93 (2013.01); Y10S 156/941 (2013.01)

(58) Field of Classification Search
USPC .................................. 156/712, 753, 930, 941
See application file for complete search history.

(56) References Cited

U.S. PATENT DOCUMENTS

| | | | | |
|---|---|---|---|---|
| 5,262,613 A | * | 11/1993 | Norris et al. ............. | 219/121.68 |
| 5,558,788 A | * | 9/1996 | Mashburn ................ | 219/121.68 |
| 6,110,806 A | | 8/2000 | Pogge | |
| 7,462,551 B2 | | 12/2008 | Kulkarni et al. | |
| 7,541,203 B1 | | 6/2009 | Knickerbocker | |
| 8,419,895 B2 | * | 4/2013 | Dang et al. ..................... | 156/703 |

(Continued)

FOREIGN PATENT DOCUMENTS

| | | | |
|---|---|---|---|
| JP | 2003188412 A | * | 7/2003 |
| JP | 2005182033 A | | 7/2005 |

OTHER PUBLICATIONS

Lu, et al—"Laser removal of Flux Residue Before Chip Attachment to Board in a Flip Chip Assembly"—Journal of Electronics Manufacturing, vol. 8, Nos. 3 & 4—Dec. 1998.

(Continued)

*Primary Examiner* — Mark A Osele
(74) *Attorney, Agent, or Firm* — Steven Meyers; L. Jeffrey Kelly

(57) ABSTRACT

A method for laser ashing of polyimide for a semiconductor manufacturing process using a structure, the structure comprising a supporting material attached to a semiconductor chip by a polyimide glue, includes releasing the supporting material from the polyimide glue, such that the polyimide glue remains on the semiconductor chip; and ashing the polyimide glue on the semiconductor chip using an ablating laser.

14 Claims, 7 Drawing Sheets

(56) References Cited

U.S. PATENT DOCUMENTS

| | | | |
|---|---|---|---|
| 2007/0017908 A1* | 1/2007 | Sercel et al. | 219/121.73 |
| 2009/0032920 A1 | 2/2009 | Buchwalter et al. | |
| 2009/0042338 A1* | 2/2009 | Purushothaman et al. | 438/118 |
| 2009/0263214 A1 | 10/2009 | Lee et al. | |
| 2010/0140785 A1 | 6/2010 | Killer et al. | |
| 2010/0295077 A1* | 11/2010 | Melman | 257/98 |

OTHER PUBLICATIONS

Application No. 2719927 Filed: Nov. 5, 2010 Canadian Office Action dated Mar. 25, 2013.

Flip Chip Packaging, [online]; [retrieved on Oct. 25, 2010]; retrieved from the Internet http://cpu.linuxmania.net/liste/cpuinfo/chip-packaging/Package-Typ/Flip-Chip-Technology.pdf.

Yoon, et al., Packaging and Assembly of 3-D Silicon Stacked Module for Image Sensor Application, IEEE Transactions of Advanced Packaging, Aug. 2008, pp. 519-526, vol. 31, No. 3, IEEE Xplore.

Removing Cured Silicone Adhesive From Electronic Components, [online]; [retrieved on Dec. 7, 2010]; retrieved from the Internet http://www.electroiq.com/index/display/packaging-article-display/276419/articles/advanced-packaging/volume-15/issue-10/features/removing-cured-silicone-adhesive-from-electronic-components.html.

* cited by examiner

100

RELEASE SUPPORTING MATERIAL FROM SEMICONDUCTOR CHIP USING LASER
101

PERFORM FIRST PLASMA CLEANING OF CARBON DEBRIS
LEFT ON SEMICONDUCTOR CHIP FROM RELEASE OF SUPPORTING MATERIAL
102

PERFORM LASER ASHING OF POLYIMIDE GLUE
103

PERFORM SECOND PLASMA CLEANING OF CARBON RESIDUE LEFT
ON SEMICONDUCTOR CHIP FROM LASER ASHING OF POLYIMIDE GLUE
104

ATTACH TOP CHIP TO SEMICONDUCTOR CHIP
105

LASER ASHING OF POLYIMIDE FOR SEMICONDUCTOR MANUFACTURING

BACKGROUND

This disclosure relates generally to the field of semiconductor chip manufacturing, and more particularly to removal of polyimide glue from a semiconductor chip during manufacturing.

During semiconductor manufacturing, multiple semiconductor chips may be formed in a single piece of a substrate (for example, a silicon substrate). The semiconductor chips may include various structures, made from various materials such as silicon oxide, silicon nitride, or metal. The semiconductor chips need to be separated in the later stages of the semiconductor manufacturing process. For example, this separation may be achieved by dicing the substrate containing the semiconductor chips. The substrate containing the semiconductor chips may require attachment to a rigid supporting material during dicing, so as to avoid damage to the semiconductor chips during dicing. A glue, which may be a polyimide glue, may be used to attach the supporting material to the substrate. After dicing, the supporting material and the glue need to be removed from the diced semiconductor chips.

Some polyimide removal methods, which may be applied to polyimide glue on a semiconductor chip, include wet etching and plasma ashing. These methods may be isotropic, which may cause damage to structures located on the semiconductor chip underneath the polyimide, and relatively slow, limiting throughput for the semiconductor manufacturing process. Wet etching may be performed using N-methyl pyrrolidinone (NMP); however, the etch rate of wet etching with NMP is relatively slow. Plasma ashing may be performed using oxygen ($O_2$) plasma or hydrofluoric plasma. For plasma ashing in $O_2$, the etch rate is also relatively slow; it may take more than 5 hours to remove the polyimide. The required temperature for $O_2$ plasma etching is also relatively high (up to 250° C.), which may damage the semiconductor chip. For hydrofluoric plasma ashing, the etch rate may be higher, but other materials in the semiconductor chip, such as silicon oxide, silicon nitride, or metal may also be etched along with the polyimide, damaging the semiconductor chip.

SUMMARY

In one aspect, a method for laser ashing of polyimide for a semiconductor manufacturing process using a structure, the structure comprising a supporting material attached to a semiconductor chip by a polyimide glue, includes releasing the supporting material from the polyimide glue, such that the polyimide glue remains on the semiconductor chip; and ashing the polyimide glue on the semiconductor chip using an ablating laser.

In another aspect, a system for laser ashing of polyimide for a semiconductor manufacturing process includes a semiconductor chip; a polyimide glue located on the semiconductor chip; and an ablating laser configured to ash the polyimide glue on the semiconductor chip.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 1 illustrates a flow chart of an embodiment of a method for laser ashing of polyimide.

DETAILED DESCRIPTION

Embodiments of systems and methods for laser ashing of polyimide are provided, with exemplary embodiments being discussed below in detail. Laser ashing of polyimide may be relatively fast and allow good throughput for the semiconductor manufacturing process. Laser ashing may also limit polyimide undercutting and be highly selective to polyimide, so that the semiconductor chip is not damaged during polyimide removal. An ultraviolet (UV) laser is used to ash, or ablate, the polyimide, as polyimide has a relatively high light absorption coefficient in the UV range and a low threshold to initiate ablation. Laser ablation is a line-of-sight, anisotropic method, which significantly reduces the risk of polyimide undercutting. Laser ablation of polyimide may also be a relatively low temperature process, under 150° C. in some embodiments. The polyimide removal process may include relatively short plasma cleaning steps before and after laser ablation of the polyimide to remove any carbon debris or residue that may be on the semiconductor chip.

Figure 2:
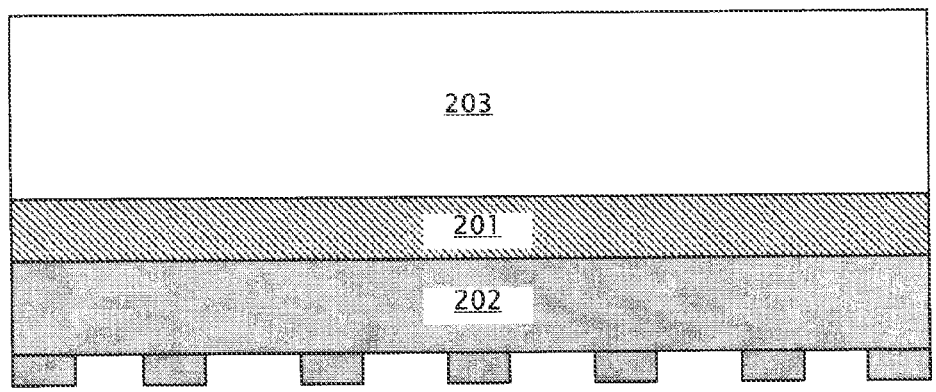
FIG. 2 is a schematic block diagram illustrating an embodiment of a semiconductor chip attached to a supporting material by a polyimide glue layer.
Figure 3:
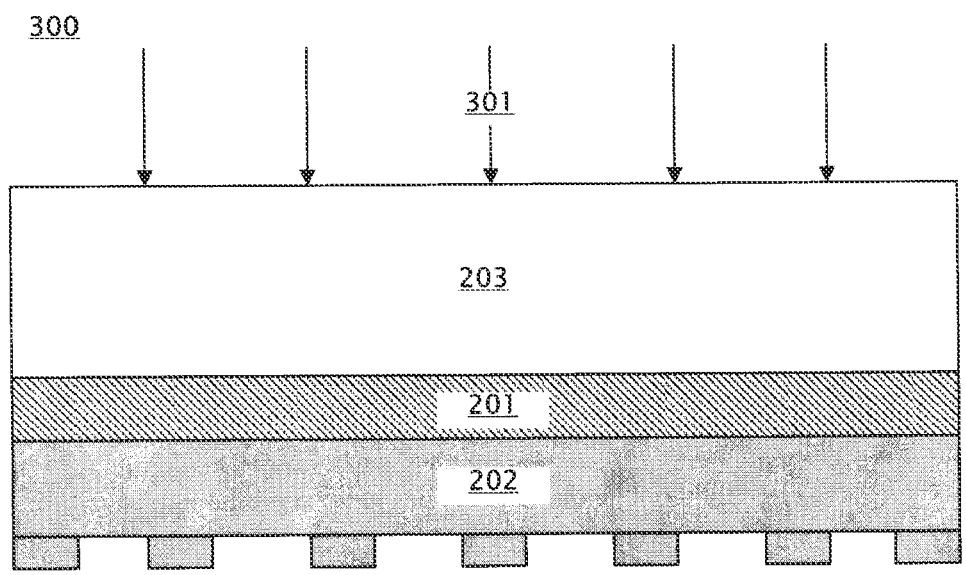
FIG. 3 is a schematic block diagram illustrating an embodiment of the semiconductor chip of FIG. 2 during release of the supporting member.

FIG. 1 illustrates a flow chart of an embodiment of a method 100 for laser ashing of polyimide. FIG. 1 is discussed with reference to FIGS. 2-7. A diced wafer 200 including a supporting material 203 attached to a semiconductor chip 202 by a polyimide glue layer 201, such as is shown in FIG. 2, is provided. Supporting material 203 may be glass in some embodiments. Semiconductor chip 202 may be any type of semiconductor chip, and may include a silicon substrate with various structures made from materials including but not limited to silicon oxide, silicon nitride, or metal. In block 101, as is shown in FIG. 3, the supporting material 203 is released using a laser 301. Laser 301 causes the polyimide glue layer 201 to release the supporting material 203. The laser release of supporting material 203 does not remove the polyimide glue layer 201 from semiconductor chip 202. The laser release of supporting material 203 may have a process time of about 10 minutes in some embodiments, and may be achieved using a laser 301 having a fluence of about 110 millijoules per centimeter squared ($mJ/cm^2$), a laser repetition rate of about 100 Hertz (Hz), and a stage speed of about 5 millimeters per second (mm/s) in some embodiments.

Figure 4:
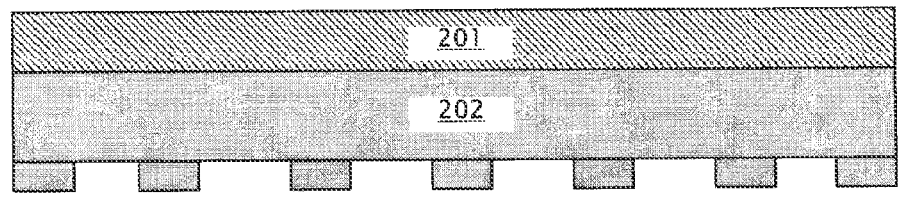
FIG. 4 is a schematic block diagram illustrating an embodiment of the semiconductor chip of FIG. 3 after release of the supporting member.

After laser release of supporting material 203 in block 101, a structure 400 including the semiconductor chip 202 with polyimide glue layer 201 remains, as is shown in FIG. 4. Then, in block 102, the polyimide glue layer 201 and semiconductor chip 202 are cleaned using plasma. The first plasma cleaning acts to clean any carbon debris that may be present on the polyimide glue layer 201 after release of the supporting material 203 in block 101, as the carbon debris may interfere with the laser ashing process (discussed below with respect to block 103). The plasma cleaning step of block 102 may include placing the structure 400 in a plasma asher for a process time of less than about an hour, and may be performed using 600 millitorr (mTorr) $O_2$ plasma at 1000 watts (W) in some embodiments. The relatively short process time for the plasma cleaning step of block 102 avoids damage to semiconductor chip 202.

Figure 5:
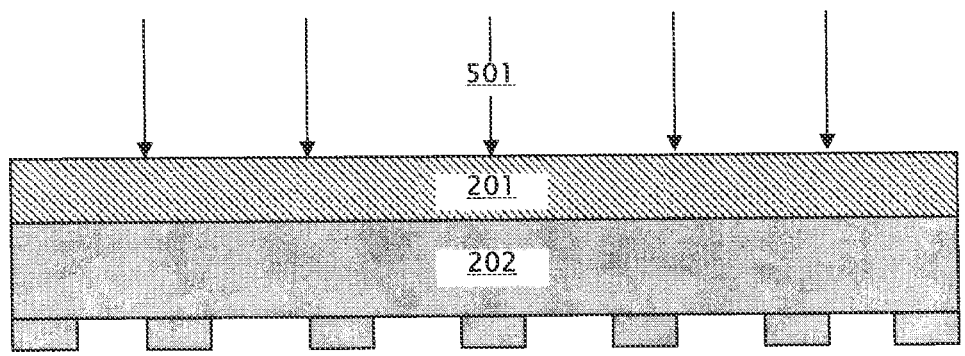
FIG. 5 is a schematic block diagram illustrating an embodiment of the semiconductor chip of FIG. 2 during laser ashing of the polyimide glue layer.

Then, in block 103, a laser 501 is used to ash the polyimide glue layer 201 as is shown in FIG. 5. The laser ashing, or ablation, acts to remove polyimide glue layer 201 from chip 202. Laser 501 is a UV laser, having a wavelength from about 10 nanometers (nm) to about 400 nm. The fluence of the laser 501 may be varied from about 100 $mJ/cm^2$ to about 300 $mJ/cm^2$ in various embodiments. The amount of polyimide removed per laser pulse (measured in nm per pulse) increases as the laser fluence is increased, for example, from about 27 nm/pulse at a fluence of 150 $mJ/cm^2$ to about 63 nm/pulse at a fluence of 250 $mJ/cm^2$. In an exemplary embodiment, laser 501 may have a fluence of about 200 $mJ/cm^2$, a laser repetition rate of about 200 Hz, and a stage speed of about 20 mm/s, resulting in a process time required for laser ablation of polyimide glue layer 201 of about 5 minutes. However, the laser repetition rate and stage speed of laser 501 may also vary in various embodiments. As many as fifteen (15) passes across polyimide glue layer 201 by laser 501 may be required for full ablation of polyimide glue layer 201 in some embodiments. Polyimide fumes may be generated during laser ablation of polyimide glue layer 201, so a fume extraction device may be provided evacuate fumes and debris from the laser ablation apparatus. A debris shield, which may be made from a material that is transparent in the UV range such as fused silica, may also be used to protect the optics of laser 501. The debris shield may be located between the source optics of laser 501 and the polyimide glue layer 201.

Figure 6:
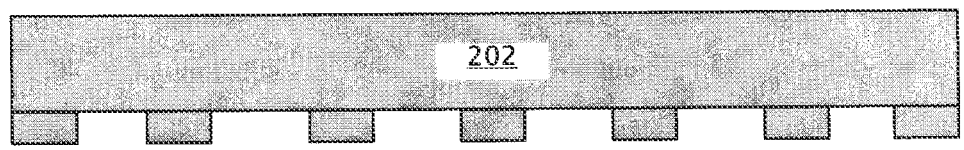
FIG. 6 is a schematic block diagram illustrating an embodiment of the semiconductor chip of FIG. 5 after laser ashing of the polyimide glue layer.
Figure 7:
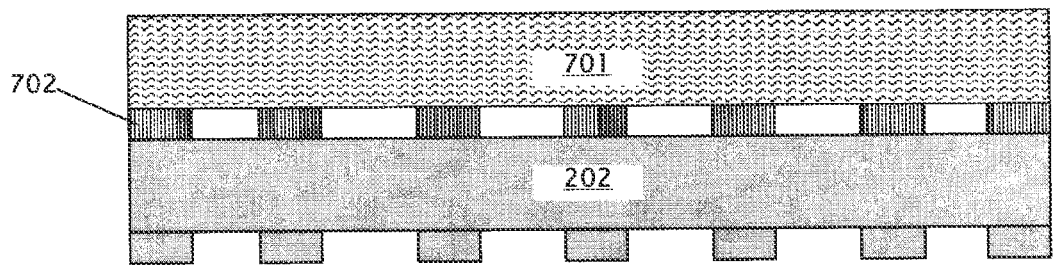
FIG. 7 is a schematic block diagram illustrating an embodiment of the semiconductor chip of FIG. 6 after attachment of a top chip.

After the laser ashing of polyimide glue layer 201 in block 103, a structure 600 including the semiconductor chip 202 remains, as shown in FIG. 6; however, structure 600 may include some carbon residue left over from the laser ashing process. Therefore, in block 104, a second plasma cleaning step performed to clean any remaining carbon residue that may be present on the semiconductor chip 202. The second plasma cleaning step of block 104 may include placing the structure 600 in a plasma asher for a process time of less than about an hour, and may be performed using 600 millitorr (mTorr) $O_2$ plasma at 1000 watts (W) in some embodiments. The relatively short process time for the plasma cleaning step of block 104 avoids damage to semiconductor chip 202.

Lastly, in block 105, a top chip 701 may be attached to the semiconductor chip 202 by a connection layer 702 to form semiconductor device 700. Top chip 701 may include any appropriate type of chip and may be attached to semiconductor chip 202 in any appropriate manner. In embodiments in which top chip 701 is connected using a flip chip technique, connection layer 702 may include a C4 layer, which may comprise solder bumps, and may be deposited on receiving pads located on the semiconductor chip 202. Top chip 701 and connection layer 702 are shown for illustrative purposes only; any appropriate devices may be connected to semiconductor chip 202 to form a final semiconductor device.

The technical effects and benefits of exemplary embodiments include increased throughput for a semiconductor manufacturing process while reducing damage to a semiconductor chip during polyimide glue removal.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for laser ashing of polyimide for a semiconductor manufacturing process using a structure, the structure comprising a supporting material attached to a semiconductor chip by a polyimide glue, wherein the method comprises:
    releasing, using a release laser, the supporting material from the polyimide glue, such that the polyimide glue remains on the semiconductor chip;
    following the releasing, performing a first plasma cleaning of the semiconductor chip, wherein carbon debris and the polyimide glue remaining on the semiconductor chip are removed;
    following the first plasma cleaning, performing a laser ashing, wherein an ashing laser is an ultraviolet (UV) laser having a wavelength from about 10 nanometers (nm) to about 400 nm and a fluence from about 100 millijoules per centimeter squared ($mJ/cm^2$) to about 300 $mJ/cm^2$; and
    following the laser ashing, performing a second plasma cleaning of the semiconductor chip, wherein carbon debris from the laser ashing is removed.

2. The method of claim 1, wherein the supporting material comprises glass.

3. The method of claim 1, wherein the release laser has a fluence of about 110 millijoules per centimeter squared ($mJ/cm^2$), a laser repetition rate of about 100 Hertz (Hz), and a stage speed of about 5 millimeters per second (mm/s).

4. The method of claim 1, further comprising the first plasma cleaning of the polyimide glue and the semiconductor chip before ashing the polyimide glue on the semiconductor chip using the laser ashing, wherein the first plasma cleaning is configured to remove carbon debris from the polyimide glue before ashing the polyimide glue.

5. The method of claim 4, wherein the first plasma cleaning has a process time of less than about an hour, and is performed using 600 millitorr (mTorr) oxygen ($O_2$) plasma at 1000 watts (W).

6. The method of claim 1, wherein the laser ashing has a process time of less than about 5 minutes.

7. The method of claim 1, wherein the laser ashing comprises an ultraviolet (UV) laser.

8. The method of claim 1, wherein the laser ashing has a fluence from about 100 mJ/cm$^2$ to about 300 mJ/cm$^2$.

9. The method of claim 1, wherein the laser ashing has a laser repetition rate of about 200 hertz (Hz).

10. The method of claim 1, wherein the laser ashing has a stage speed of about 20 millimeters per second (mm/s).

11. The method of claim 1, further comprising a second plasma cleaning of the semiconductor chip after ashing the polyimide glue on the semiconductor chip using the laser ashing, wherein the second plasma cleaning is configured to remove carbon residue from the semiconductor chip.

12. The method of claim 11, wherein the second plasma cleaning has a process time of less than about an hour, and is performed using 600 mTorr $O_2$ plasma at 1000 W.

13. The method of claim 1, further comprising attaching a top chip to the semiconductor chip after the second plasma cleaning using the laser ashing.

14. The method of claim 13, wherein the top chip comprises a flip chip, and wherein the flip chip is attached to a receiving pad on the semiconductor chip by a C4 layer.

\* \* \* \* \*